(12) United States Patent  
Wong et al.

(10) Patent No.: US 7,049,188 B2  
(45) Date of Patent: May 23, 2006

(54) LATERAL DOPED CHANNEL

(75) Inventors: Nga-Ching Wong, San Jose, CA (US); Timothy Thurgate, Sunnyvale, CA (US); Sameer S. Haddad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/305,724

(22) Filed: Nov. 26, 2002

(65) Prior Publication Data

US 2004/0102026 A1    May 27, 2004

(51) Int. Cl.  
*H01L 21/8238* (2006.01)

(52) U.S. Cl. .................. 438/201; 438/211; 438/217
(58) Field of Classification Search .......... 438/201, 438/211, 217, 230, 231, 257; 257/314, 315, 257/316, 318, 319, 336

See application file for complete search history.

(56) References Cited

U.S. PATENT DOCUMENTS

| | | | | |
|---|---|---|---|---|
| 4,968,639 A | * | 11/1990 | Bergonzoni | 438/231 |
| 5,337,274 A | * | 8/1994 | Ohji | 365/185.01 |
| 5,841,170 A | * | 11/1998 | Adan et al. | 257/345 |
| 6,238,982 B1 | | 5/2001 | Krivokapic et al. | 438/275 |
| 6,287,917 B1 | | 9/2001 | Park et al. | 438/262 |
| 6,479,346 B1 | | 11/2002 | Yi et al. | 438/257 |
| 6,486,029 B1 | * | 11/2002 | Foote et al. | 438/261 |
| 6,580,103 B1 | * | 6/2003 | Yi et al. | 257/202 |
| 2002/0127802 A1 | | 9/2002 | Goda et al. | 438/257 |

* cited by examiner

Primary Examiner—Hoai Pham (57) ABSTRACT

A lateral doped channel. A first doping material is implanted substantially vertically into a region adjacent to a gate structure. A diffusion process diffuses the first doping material into a channel region beneath the gate structure. A second doping material is implanted substantially vertically into the region adjacent to a gate structure. The second implantation forms source/drain regions and may terminate the channel region. The channel region thus comprises a laterally non-uniform doping profile which beneficially mitigates the short channel effect and is highly advantageous as compensation for manufacturing process variations in channel length.

5 Claims, 12 Drawing Sheets

LATERAL DOPED CHANNEL

TECHNICAL FIELD

Embodiments of the present invention relate to design of sub-micron metal oxide semiconductors. More particularly, embodiments of the present invention provide a lateral doped channel to improve the short channel effect.

BACKGROUND ART

Flash memory is a type of semiconductor computer memory with many desirable characteristics. Like read only memory, ROM, it is non-volatile, meaning that the contents of the memory are stable and retained without applied electrical power.

Flash memory devices have found wide commercial success in the electronic device market. A major advantage of flash over ROM is that the memory contents of flash may be changed after the device is manufactured. Flash memory has found wide acceptance in many types of computers, including desktop computers, mobile phones and hand held computers. Flash memory is also widely used in digital cameras and portable digital music players, for example "MP3" players.

In addition to direct flash storage applications, for example in video cameras, flash-based storage devices are replacing rotating magnetic disks, sometimes known as hard drives, in many applications. Compared to hard drives, flash is significantly more rugged, quieter, lower power, and for some densities such a flash based device may be smaller than a comparable hard drive.

Figure 1A:
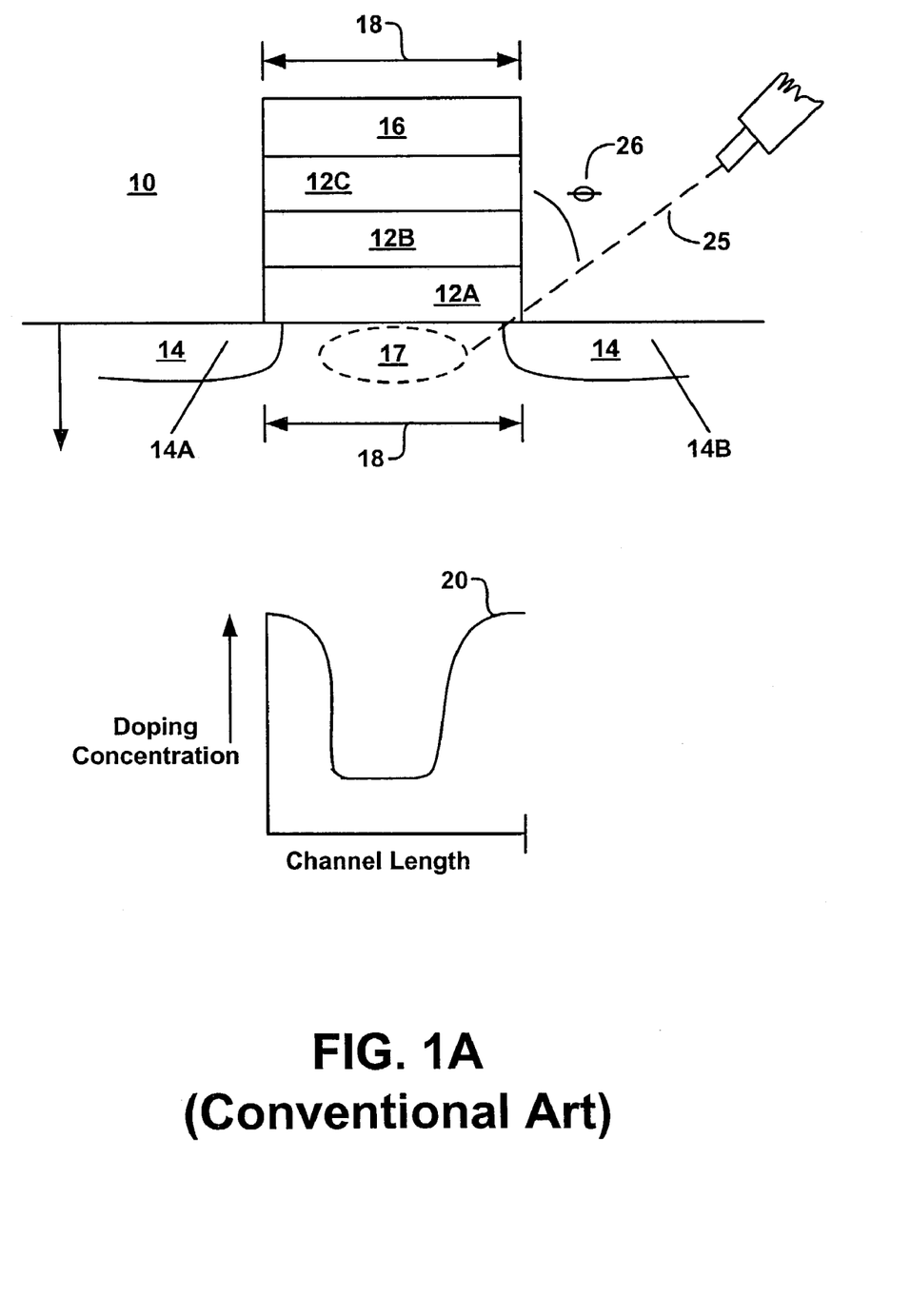
FIG. 1A shows a memory cell as has been well known in the conventional art.

FIG. 1A shows a memory cell 10 as has been well known in the conventional art. Regions 14 are the drain and/or source regions for memory cell 10. They may be used as source and/or drain interchangeably. Control gate 16 is used to control the operation of memory cell 10. A channel region 17 is formed between source/drain regions 14. Feature size 18 is the nominal size of the smallest feature that can be created by a particular semiconductor process. In memory cells of this type, the gate 16 width and channel 17 length typically correspond approximately to feature size 18.

Memory cell 10 may be one of two general types of non-volatile memory, a "floating gate" cell or a nitride read only memory (NROM) cell. In a floating gate cell, layer 12B of the gate stack is typically conductive polysilicon. Layers 12A and 12C are insulating materials which isolate or "float" gate layer 12B, which is usually referred to as a floating gate. Floating gate 12B is the storage element of memory cell 10.

Silicon nitride based flash memory has many advantages as compared to its floating gate and tunneling oxide based counterparts. Silicon-Oxide-Nitride-Oxide-Silicon (SONOS) is potentially very dense in terms of number of cells per unit area that can be used and it requires fewer process steps as compared to floating gate memory. Moreover, it can be easily integrated with standard SRAM process technology. A further advantage of using SONOS devices is their suitability for applications requiring large temperature variations and radiation hardening. The SONOS stack is a gate dielectric stack and consists of a single layer of polysilicon, a triple stack ONO (Oxide-Nitride-Oxide) gate dielectric layer and a MOS channel 17. The ONO structure may consist or a tunnel oxide 12A, a nitride memory storage layer 12B and a blocking oxide layer 12C.

Flash memory devices are typically configured as an array of many instanced of individual cells, e.g., cell 10, oriented in rows and columns. Typically, the control gates, e.g., control gate 16 of FIG. 1, of the cells in each row are connected to a series of word lines, thus forming individual rows of cells that can be accessed by selecting the corresponding word line. Similarly, the source and/or drain, e.g., regions 14, of the cells in each column are connected to a series of bit lines, thus forming individual columns of cells that can be accessed by selecting the corresponding bit lines.

Memory device manufacturers are continually challenged to provide ever greater amounts of memory at ever lower costs. Recently, Advanced Micro Devices, Incorporated of California has introduced MIRROR BIT™ nitride-based flash ROM that stores multiple bits per memory cell 10 physically separated in nitride layer 12B. Such storage of multiple bits per cell increases the storage density of the memory device, thereby reducing the cost per bit of storage.

To read a bit stored in the "left" portion of memory cell 10, a word line is brought to a read voltage of about 4.5 volts and a bit line is grounded. Node 14A (the "left" instance of regions 14) functions as a source for the cell, and current flows from node 14B, acting as a drain, to node 14A through a bit line to ground. Sensing logic connected to the bit line can interpret the magnitude of tie current (which is affected by the amount of charge stored in nitride gate layer 12B, in order to determine if a bit is stored in the "left" portion of cell 10.

To read a bit stored in the "right" portion of memory cell 10, a word line is brought to a read voltage of about 4.5 volts and a bit line is grounded. Node 14B (the "right" instance of regions 14) functions as a source for the cell, and current flows from node 14A, acting as a drain, to node 14B through a bit line to ground. Sensing logic connected to the bit line can interpret the magnitude of the current (which is affected by the amount of charge stored in nitride gate layer 12B, in order to determine if a bit is stored in the "right" portion of cell 10.

To write (or program) a bit into the "left" portion of memory cell 10, a line is brought to a programming voltage of about 9.5 volts, and a bit line is grounded and acts as a source. Current is sourced from the word line through node 14A into bit line. The current causes hot carrier injection of charge into the nitride layer of the SONOS stack in physical proximity to node 14A.

To write (or program) a bit into the "right" portion of memory cell 10, a line is brought to a programming voltage of about 9.5 volts, and a bit line is grounded and acts as a source. Current is sourced from the word line through node 14B into bit line. The current causes hot carrier injection of charge into the nitride layer of the SONOS stack in physical proximity to node 14B.

Another primary approach employed to achieve lower memory costs is the industry-wide on-going reduction in semiconductor feature size. By making features, such as signal lines and transistors smaller, more memory devices may be placed in a given die area, resulting in lower production costs.

However, as feature size 18 decreases to, for example, about 0.3 microns and smaller, the channel length also decreases. As channel length grows shorter, threshold voltage begins to decrease and leakage current increases. These effects are commonly referred to in the semiconductor arts as the "short channel effect." An increase in leakage current is particularly onerous in flash memory devices as flash has found wide acceptance in very low power applications, for example mobile phones, due to the ability of flash to retain information without applied power. Increases in leakage current may have a significant deleterious effect on total power consumption of the flash device and the product using the flash device. Consequently, much research and development effort has gone into mitigating the short channel effect.

A conventional approach to mitigate the short channel effect is to have a non-uniform lateral (horizontal as depicted in FIG. 1) doping profile. Doping profile 20 illustrates such a non-uniform lateral doping profile. In the portion of channel region 17 near source/drain regions 14 the concentration of doping material is high, for example approximately in the range $1\times10^{17}$~$5\times10^{18}$ atoms/cm$^{-3}$. In the "middle" of channel region 17, the concentration of doping material is lower than the doping concentration of a non-engineered channel. A laterally non-uniform channel is especially advantageous in compensating for channel length variations due to manufacturing process variability. If the channel length is increased, the length of the "middle" channel of low doping concentration is increased, which tends to keep the threshold voltage constant. Similarly, if the channel length is shortened, the "middle" channel is shortened, increasing the influence of the end regions of high doping concentration, which again tends to keep the threshold voltage constant.

The primary and conventional method of creating such a non-uniform lateral channel in MOS devices involves tilt angle implantation. A focused ion beam 25 generally containing one particle species (atom, molecule or atom cluster) is beamed into the semiconductor material. In order to implant the particles under a gate stack, e.g., layers 12A, 12B, 12C and 16, the beam is tilted at an angle "theta" 26 from the wafer normal. Doping may be conducted at several angles. By controlling numerous well known process variables, including e.g., dopant species, beam energy, angle(s) and time, a desired doping profile may be created in channel region 17.

Figure 1B:
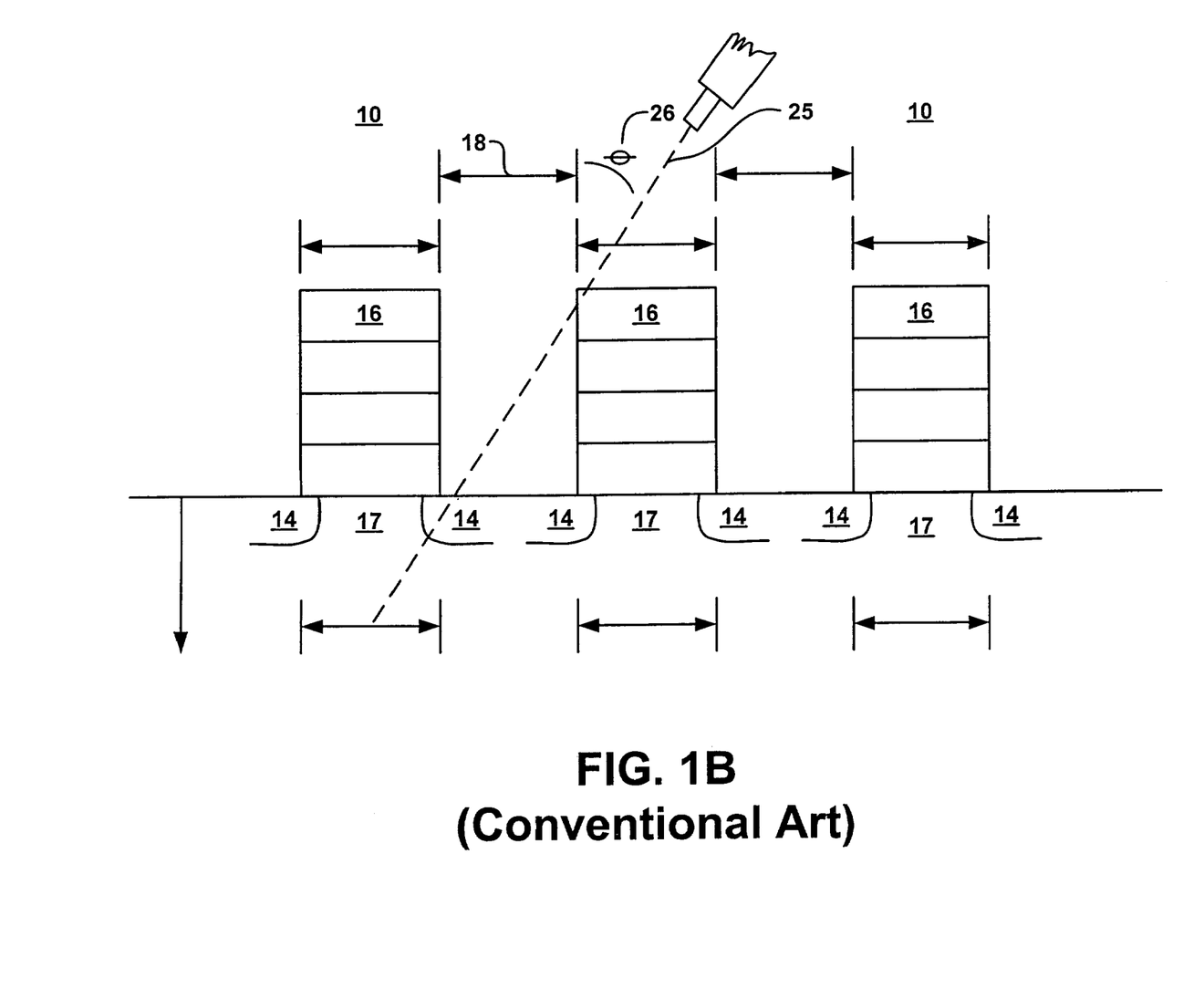
FIG. 1B illustrates three instances of a memory cell as a portion of a larger memory array.

Bulk memory integrated circuits comprise vast numbers of memory cells 10, placed as close together as possible in order to increase storage density and reduce costs. FIG. 1B illustrates three instances of memory cell 10 as a portion of a larger memory array. In addition to feature size 18 corresponding to gate width and channel width as described above, feature size 18 additionally nominally corresponds to the separation between instances of memory cell 10 within a larger array. Further, the gate structures of memory cells 10 extend in the third dimension, i.e., in and out of the drawing sheet.

Unfortunately, as feature size 18 decreases, (or example to 0.2 microns and smaller, tilt angle theta 26 becomes limited due to beam interference/obstruction with structures adjacent to the target, for example the gate stack of an adjacent memory cell. Consequently, in order to obtain the advantages of a non-uniform lateral channel, a new technique of constructing such a channel must be developed.

Semiconductor processing equipment is extremely expensive. Fundamental semiconductor processing steps, e.g., implantation and diffusion, typically require long periods of development and extensive qualification testing. Any solution to the short channel effect should be compatible with existing semiconductor processes and equipment without the need for revamping well established tools and techniques.

Thus a need exists to prevent short channel effects in dense arrays of memory cells. A further need exists for preventing short channel effects in a manner that is compatible and complimentary with conventional approaches to minimize short channel effects. A still further need exists for the above mentioned needs to be achieved with existing semiconductor processes and equipment without revamping well established tools and techniques.

DISCLOSURE OF THE INVENTION

Embodiments of the present invention provide a means to prevent short channel effects in dense arrays of memory cells. Further embodiments of the present invention prevent short channel effects in a manner that is compatible and complimentary with existing approaches to minimize short channel effects. Still further embodiments of the present invention provide for the above mentioned solutions to be achieved with existing semiconductor processes and equipment without revamping well established tools and techniques.

A lateral doped channel is disclosed. A first doping material is implanted substantially vertically into a region adjacent to a gate structure. A diffusion process diffuses the first doping material into a channel region beneath the gate structure. A second doping material is implanted substantially vertically into the region adjacent to a gate structure. The second implantation forms source/drain regions and may terminate the channel region. The channel region thus comprises a laterally non-uniform doping profile which beneficially mitigates the short channel effect and is highly advantageous as compensation for manufacturing process variations in channel length.

BEST MODE FOR CARRYING OUT THE INVENTION

In the following detailed description of the present invention, lateral doped channel, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

Lateral Doped Channel

Embodiments of the present invention are described in the context of design and operation of flash memory devices.

However, it is appreciated that embodiments of the present invention may be utilized in other areas of electronic design and operation.

Figure 2A:
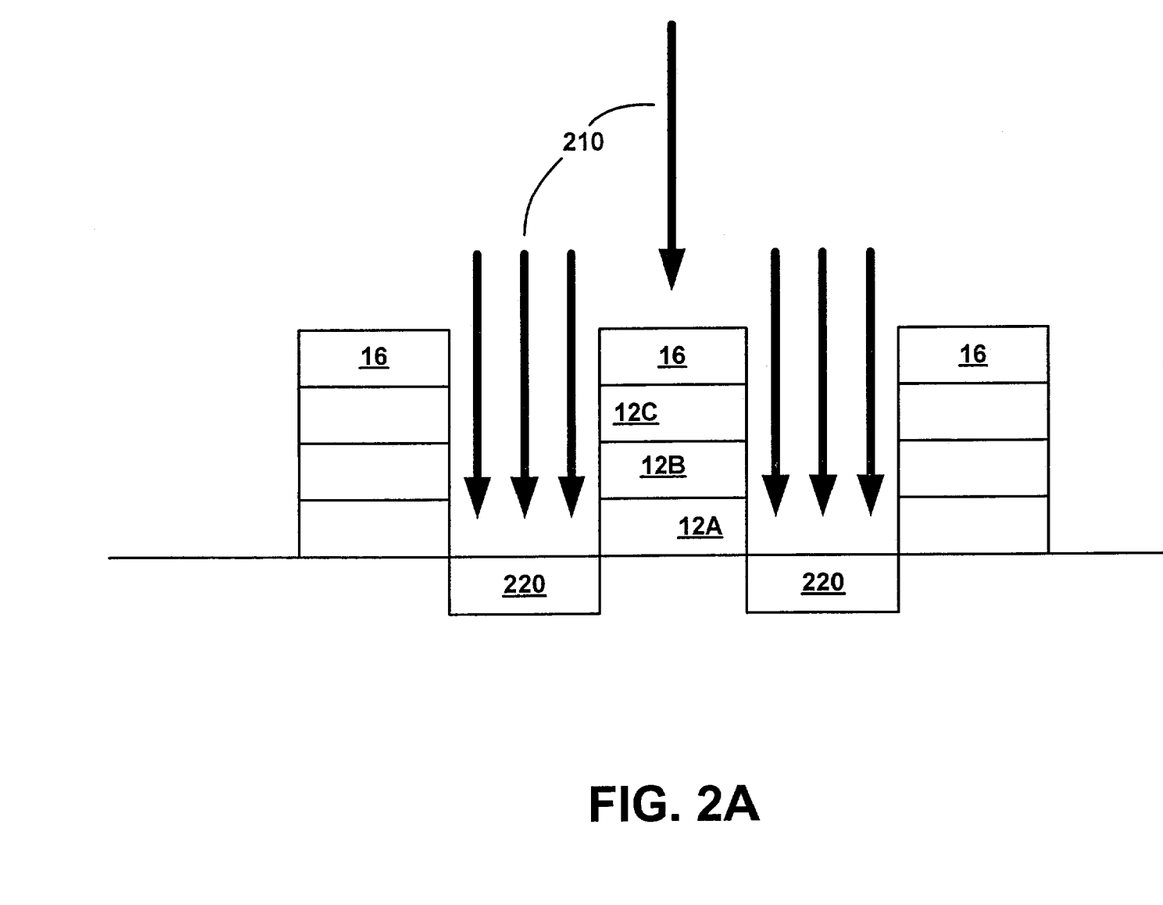
FIGS. 2A, 2B and 2C illustrate a method of manufacturing a lateral doped channel, according to and embodiment of the present invention.
Figure 2B:
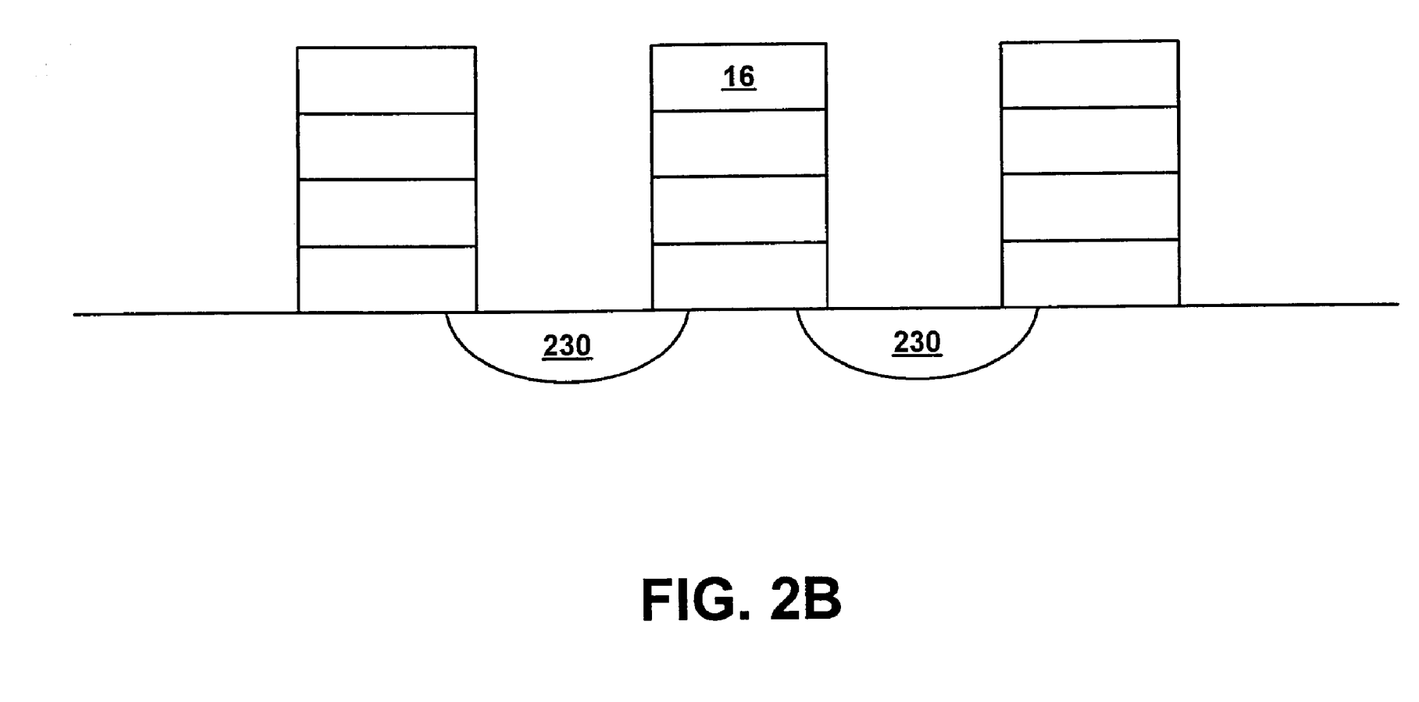
Figure 2C:
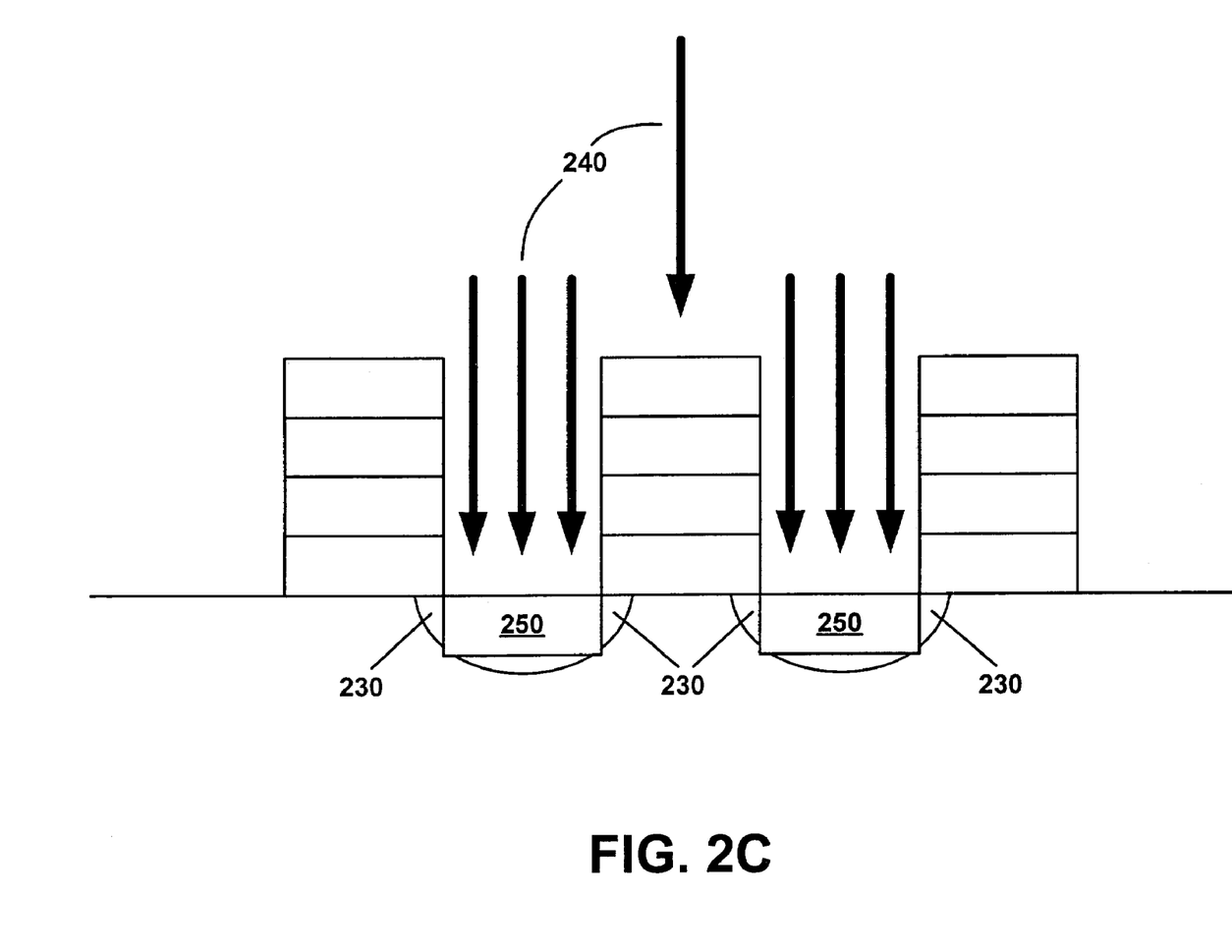
Figure 2D:
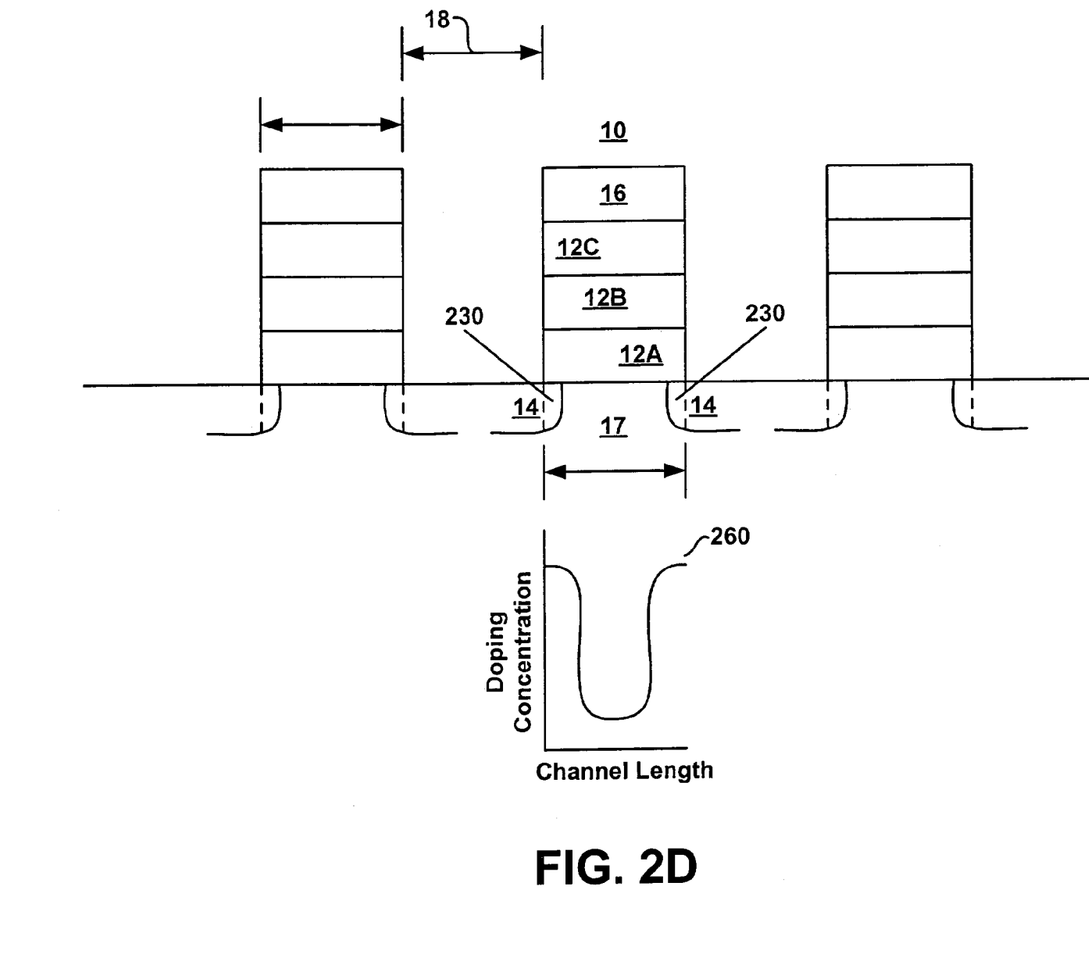
FIG. 2D illustrates a lateral doped channel, according to an embodiment of the present invention.

FIGS. 2A through 2C illustrate a method of manufacturing a lateral doped channel, according to an embodiment of the present invention. FIG. 2A illustrates three instances of memory cell 10 as a portion of a larger memory array. It is appreciated that the spacing between cells 10 (typically corresponding approximately to process feature size 18 as shown in FIGS. 1A and 2D) in conjunction with the height of the gate structure(s) renders conventional methods of forming a lateral doped channel, e.g., tilt angle implantation, infeasible or commercially non-viable.

A first doping material 210, for example Boron, is implanted substantially vertically into a region adjacent to a gate structure comprising control gate 16, insulating layers 12A and 12C and storage element (layer) 12B. Regions of high doping concentration 220 are formed in the regions adjacent to the gate structure. Regions 220 may, for example, have a high concentration of P-type charge carriers.

Subsequently, a diffusion operation is performed, for example by baking a semiconductor wafer at a temperature of approximately 800 to 950 degrees Celsius for approximately 15 minutes, according to an embodiment of the present invention. FIG. 2B illustrates regions 230 of diffused first doping material. It is appreciated that doping material diffuses underneath portions of the gate structure. For example, a portion of regions 230 underneath the gate structure may have an increased concentration of P-type dopants. Preferably, well known process variables, for example, temperature, pressure and time, are controlled such that diffusion carries doping material a beneficial distance underneath the gate structure. Typically, diffusion is limited such that a middle portion of the region directly underneath the gate structure receives little or no doping material in the diffusion process.

In FIG. 2C a second doping material 240, for example Arsenic, is implanted substantially vertically into the region adjacent to the gate structure, according to an embodiment of the present invention. This implanting forms regions 250 with a high concentration of the second doping material. Regions 250 may, for example, have a high concentration of N-type charge carriers. It is to be appreciated that due to the substantially vertical nature of the implantation, portions of regions 230 which were formed underneath the gate structure are not substantially affected by this implantation, and retain their previous characteristics. Preferably, well known process variables, for example, beam energy and doping concentration, are controlled such that the charge carrier characteristics of region 250 are substantially dominated by the second doping material 240. For example, if the first doping material 210 was a P-type material, and the second doping material 240 was an N-type material, subsequent to the second doping the doped region should have N-type characteristics.

FIG. 2D illustrates a lateral doped channel, according to an embodiment of the present invention. Source/drain regions 14 are formed, in part, by the implantation of the second doping material. Source/drain regions 14 may be primarily N-type regions. Channel region 17 comprises portions of regions 230 near the projection of the edge of the gate structure as well as a middle portion substantially unaffected by the processing described herein. Channel region 17 may be primarily a P-type region. Doping profile 260 of FIG. 2D illustrates an exemplary doping concentration versus channel length for channel region 17.

As a beneficial result, memory cell 10 comprises a laterally non-uniform doped channel, according to an embodiment of the present invention. Such a channel is advantageous in overcoming the short channel effect common to semiconductors with fine process geometries. A laterally non-uniform channel is especially advantageous in compensating for channel length variations due to manufacturing process variability. If the channel length is increased, the length of the "middle" channel of low doping concentration is increased, which tends to keep the threshold voltage constant. Similarly, if the channel length is shortened, the "middle" channel is shortened, increasing the influence of the end regions of high doping concentration, which again tends to keep the threshold voltage constant.

Further, embodiments of the present invention may be self-aligned, for example by using the gate structure as a shadow mask. Consequently, embodiments of the present invention may be beneficial in situations in which conventional techniques, e.g., tilt angle implantation, are otherwise feasible.

It is to be appreciated that although an NMOS device has been illustrated herein, embodiments of the present invention are well suited to PMOS devices as well. The choices of materials, e.g., for dopants, for use with PMOS devices are well understood in the semiconductor arts.

Figure 3:
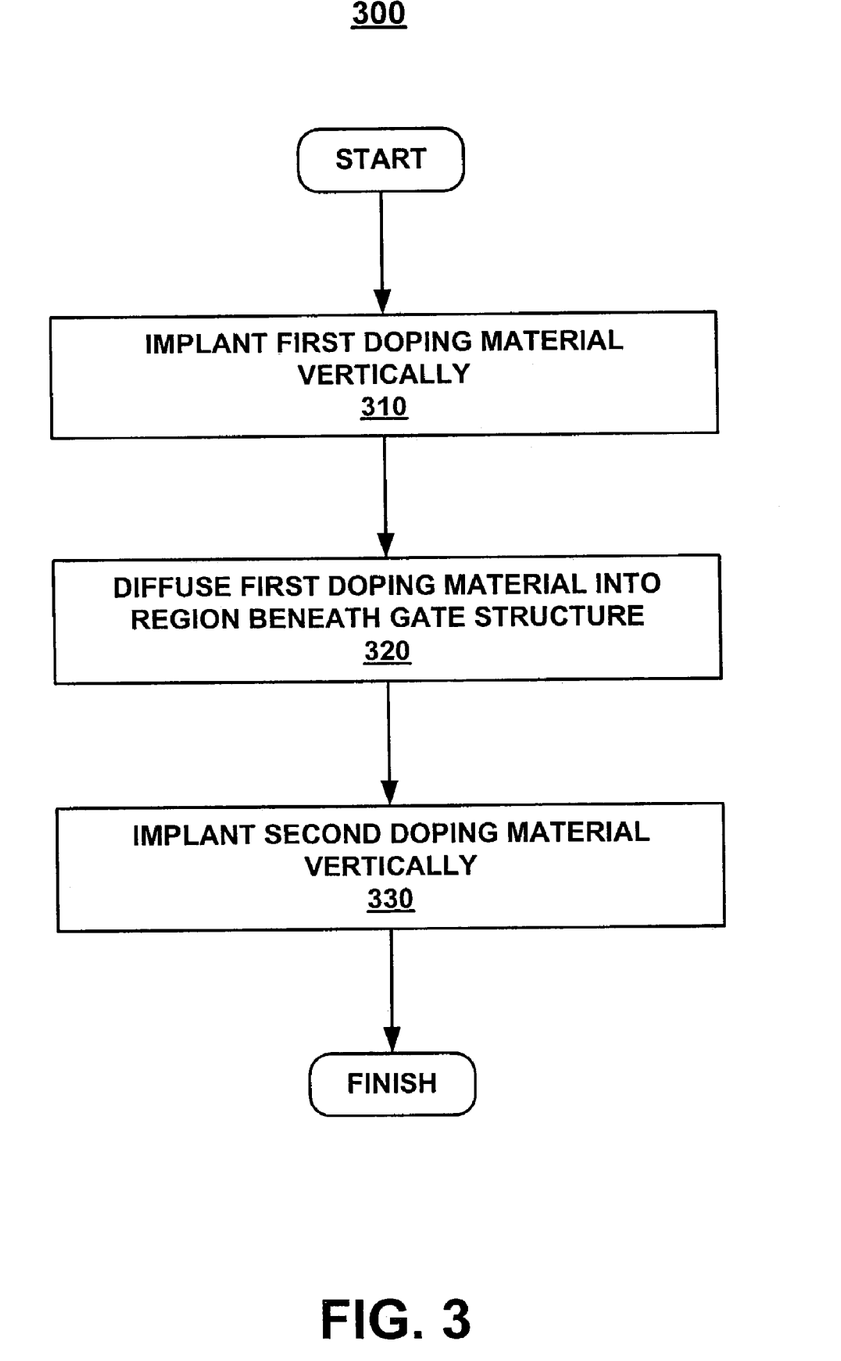
FIG. 3 illustrates a process for a method of manufacturing a lateral doped channel, according to an embodiment of the present invention.

FIG. 3 illustrates a process 300 for a method of manufacturing a lateral doped channel, according to an embodiment of the present invention.

In step 310, a first doping material, for example Boron, is implanted substantially vertically into a region adjacent to a gate structure, which may, for example, comprise control gate 16, insulating layers 12A and 12C and storage element (layer) 12B of FIG. 1A. As a result of the doping, regions of high doping concentration are formed in the regions adjacent to the gate structure. These regions may, for example, have a high concentration of P-type charge carriers.

In step 320, a diffusion operation is performed, for example by baking a semiconductor wafer at a temperature of approximately 800 to 950 degrees Celsius for approximately 15 minutes, according to an embodiment of the present invention. It is appreciated that doping material diffuses underneath portions of the gate structure. For example, a portion of a region underneath the gate structure may have an increased concentration of P-type carriers. Preferably, well known process variables, for example, temperature, pressure and time, are controlled such that diffusion carries doping material a beneficial distance underneath the gate structure. Typically, diffusion is limited such that a middle portion of the region directly underneath the gate structure receives little or no doping material in the diffusion process.

In step 330, a second doping material, for example Arsenic, is implanted substantially vertically into the region adjacent to the gate structure, according to an embodiment of the present invention. This implanting forms a region of doped material adjacent to the gate structure with a high concentration of the second doping material. The region may, for example, have a high concentration of N-type charge carriers. It is to be appreciated that due to the substantially vertical nature of the implantation, portions of the diffusion regions that were formed underneath the gate structure are not substantially affected by this implantation, and retain their previous characteristics, for example a P-type characteristic. Preferably, well known process parameters, for example, beam energy and doping concentration, are controlled such that the charge carrier characteristics of regions adjacent to the gate structure are substantially dominated by the second doping material. For example, if the first doping material was a P-type material, and the second doping material was an N-type material, subsequent to the second doping the doped region should have N-type characteristics.

Figure 4A:
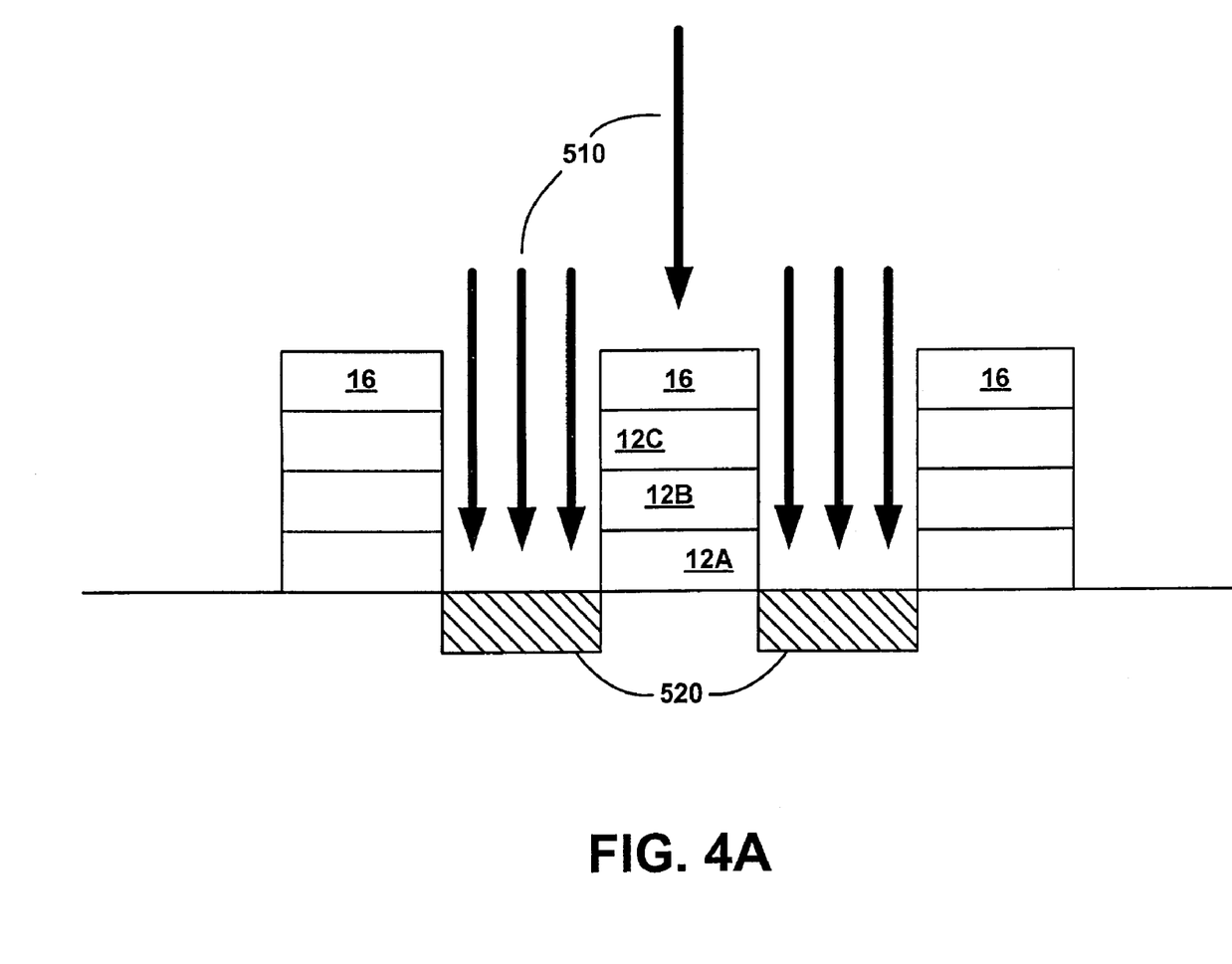
FIGS. 4A, 4B and 4C illustrate a method of manufacturing a lateral doped channel, according to and embodiment of the present invention.
Figure 4B:
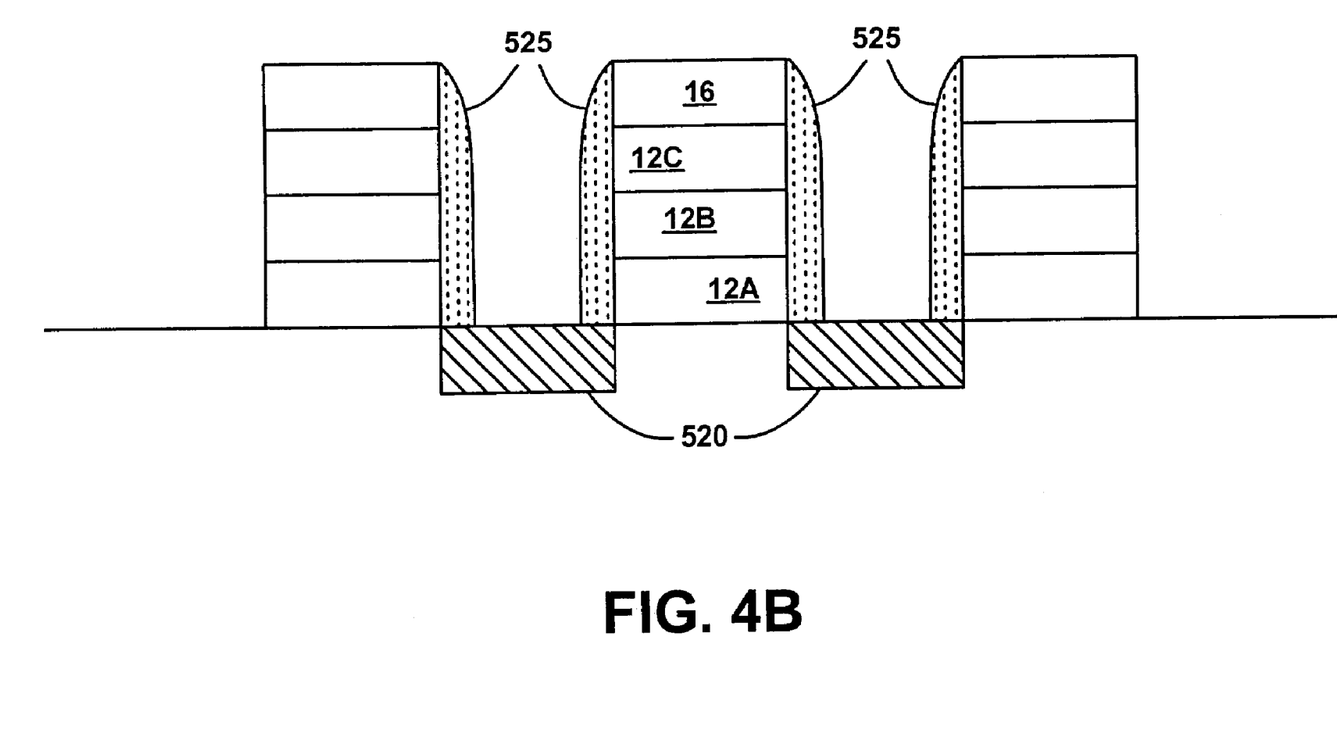
Figure 4C:
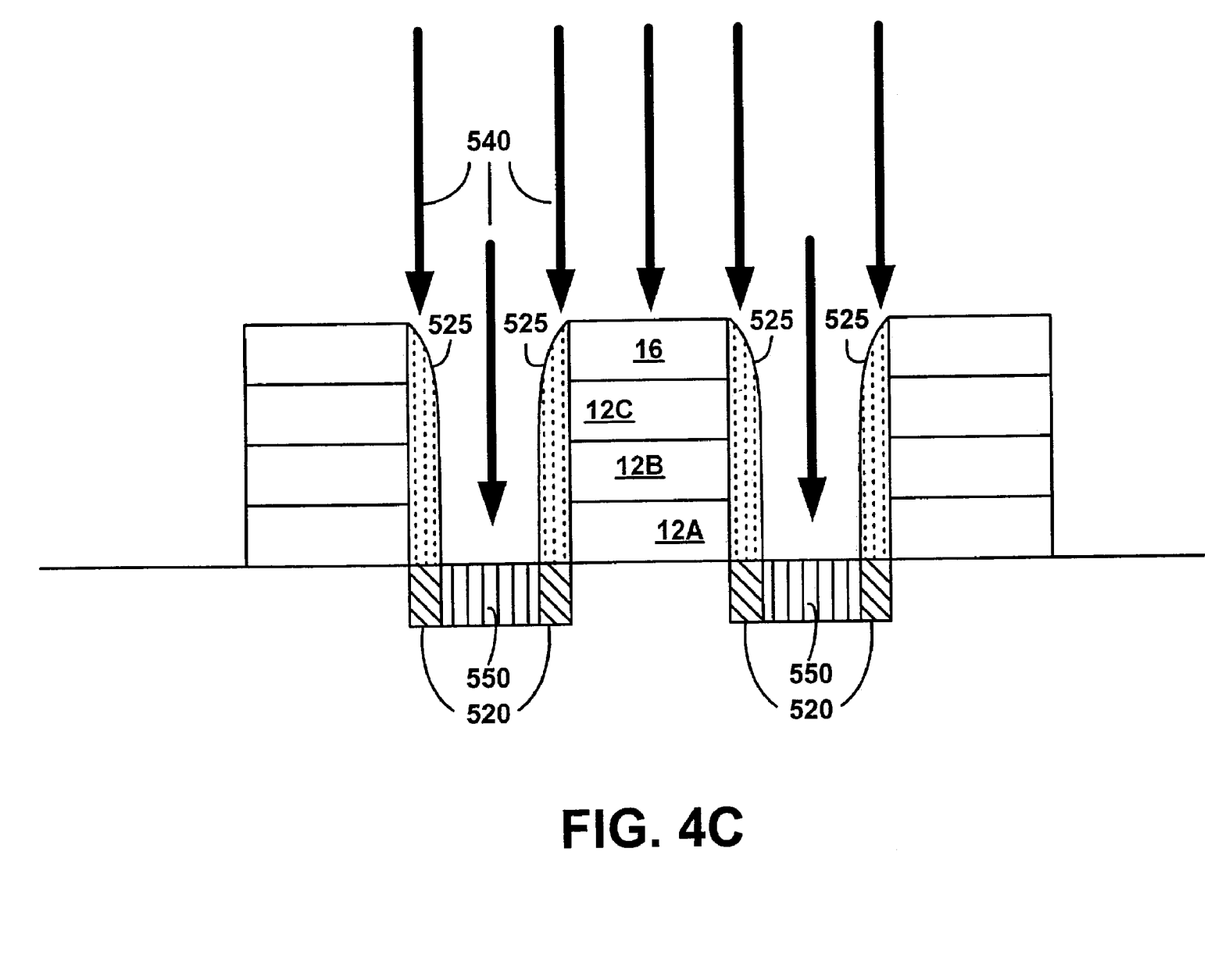

FIGS. 4A through 4C illustrate a method of manufacturing a lateral doped channel, according to an embodiment of the present invention. FIG. 4A illustrates three instances of memory cell 10 as a portion of a larger memory array. It is appreciated that the spacing between cells 10 (typically corresponding approximately to process feature size 18 as shown in FIG. 1A) in conjunction with the height of the gate structure(s) renders conventional methods of forming a lateral doped channel, e.g., tilt angle implantation, infeasible or commercially non-viable.

A first doping material 510, for example Boron, is implanted substantially vertically into a region adjacent to a gate structure comprising control gate 16, insulating layers 12A and 12C and storage element (layer) 12B. Regions of high doping concentration 520 are formed in the regions adjacent to the gate structure. Regions 520 may, for example, have a high concentration of P-type charge carriers.

Subsequently, a spacer 525 is constructed along the walls of a gate structure, as illustrated in FIG. 4B according to an embodiment of the present invention. For example, a layer of nitride or oxide may be deposited and a portion etched away to form spacer 525.

In FIG. 4C a second doping material 540, for example Arsenic, is implanted substantially vertically into the region adjacent to the gate structure, according to an embodiment of the present invention. Spacer 525 acts as a shadow mask, preventing substantial implantation of material 540 in regions underneath spacer 525. This implanting forms regions 550 with a high concentration of the second doping material. Regions 550 may, for example, have a high concentration of N-type charge carriers. It is to be appreciated that due to the substantially vertical nature of the implantation, portions of regions 520, which were formed underneath the spacer 525, are not substantially affected by this implantation, and retain their previous characteristics. Preferably, well known process variables, for example, beam energy and doping concentration, are controlled such that the charge carrier characteristics of region 550 are substantially dominated by the second doping material 540. For example, if the first doping material 510 was a P-type material, and the second doping material 540 was an N-type material, subsequent to the second doping the doped region should have N-type characteristics.

Figure 4D:
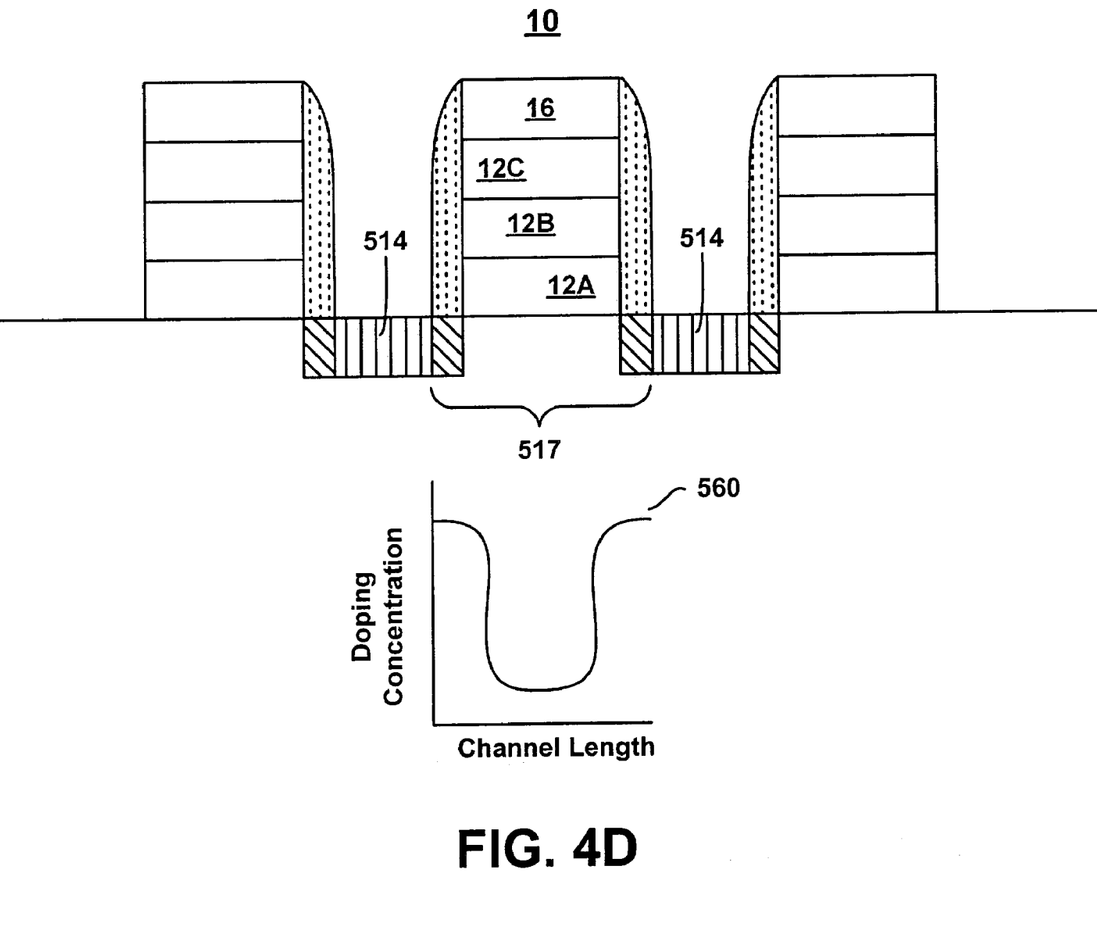
FIG. 4D illustrates a lateral doped channel, according to an embodiment of the present invention.

FIG. 4D illustrates a lateral doped channel, according to an embodiment of the present invention. Source/drain regions 514 are formed, in part, by the implantation of the second doping material. Source/drain regions 514 may be primarily N-type regions. Channel region 517 comprises portions of regions 520 substantially underneath spacer 525 and near the projection of the edge of the gate structure, as well as a middle portion substantially unaffected by the processing described herein. Channel region 517 may be primarily a P-type region. Doping profile 560 of FIG. 4D illustrates an exemplary doping concentration versus channel length for channel region 517.

As a beneficial result, memory cell 10 comprises a laterally non-uniform doped channel, according to an embodiment of the present invention. Such a channel is advantageous in overcoming the short channel effect common to semiconductors with fine process geometries. A laterally non-uniform channel is especially advantageous in compensating for channel length variations due to manufacturing process variability. If the channel length is increased, the length of the "middle" channel of low doping concentration is increased, which tends to keep the threshold voltage constant. Similarly, if the channel length is shortened, the "middle" channel is shortened, increasing the influence of the end regions of high doping concentration, which again tends to keep the threshold voltage constant.

Further, embodiments of the present invention may be self-aligned, for example by using the gate and spacer 525 structures as shadow masks. Consequently, embodiments of the present invention may be beneficial in situations in which conventional techniques, e.g., tilt angle implantation, are otherwise feasible.

It is to be appreciated that channel region 517 may be longer than nominal minimum feature size 18, according to an embodiment of the present invention. The length of channel region 517 may be increased by approximately the "width" of two sides of spacer 525 over the width of a gate structure. Such increased channel length may further beneficially mitigate a short channel effect by making the channel physically less short.

It is to be appreciated that although an NMOS device has been illustrated herein, embodiments of the present invention are well suited to PMOS devices as well. The choices of materials, e.g., for dopants, for use with PMOS devices are well understood in the semiconductor arts.

Figure 5:
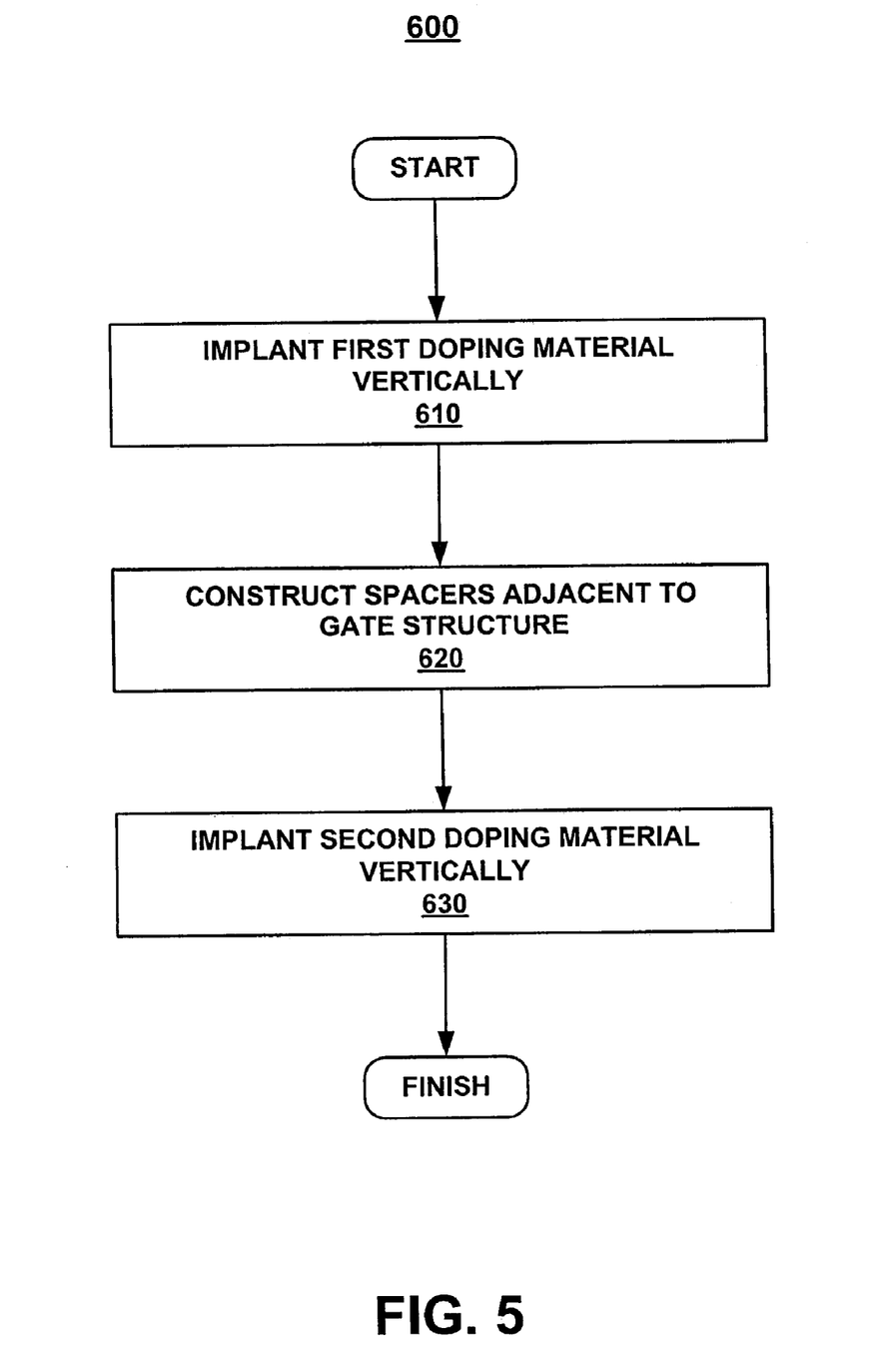
FIG. 5 illustrates a process for a method of manufacturing a lateral doped channel, according to an embodiment of the present invention.

FIG. 5 illustrates a process 600 for a method of manufacturing a lateral doped channel, according to an embodiment of the present invention.

In step 610, a first doping material, for example Boron, is implanted substantially vertically into a region adjacent to a gate structure, which may, for example, comprise control gate 16, insulating layers 12A and 12C and storage element (layer) 12B of FIG. 1A. As a result of the doping, regions of high doping concentration are formed in the regions adjacent to the gate structure. These regions may, for example, have a high concentration of P-type charge carriers.

In step 620, spacers are constructed adjacent to the gate structure. The spacers, e.g., spacers 525 of FIG. 4B, may be constructed from a layer of nitride that is selectively etched away.

In step 630, a second doping material, for example Arsenic, is implanted substantially vertically into the region adjacent to the gate structure, according to an embodiment of the present invention. The spacers constructed in step 620 act as a shadow mask, preventing substantial implantation of the second doping material in regions underneath the spacers. This implanting forms a region of doped material with a high concentration of the second doping material. The region may, for example, have a high concentration of N-type charge carriers. It is to be appreciated that due to the substantially vertical nature of the implantation, portions of the regions which were underneath the spacers are not substantially affected by this implantation, and retain their previous characteristics, for example a P-type characteristic. Preferably, well known process parameters, for example, beam energy and doping concentration, arc controlled such that the charge carrier characteristics of regions adjacent to the gate structure are substantially dominated by the second doping material. For example, if the first doping material was a P-type material, and the second doping material was an N-type material, subsequent to the second doping the doped region should have N-type characteristics.

This novel design and method to implement a lateral doped channel enable decreased feature size and increased density of memory cells and may reduce manufacturing costs. These beneficial results allow for less expensive memory devices with lower power consumption, rendering a competitive advantage to the users practicing embodiments of the present invention.

Embodiments of the present invention provide a means to prevent short channel effects in dense arrays of memory cells. Further embodiments of the present invention prevent short channel effects in a manner that is compatible and complimentary with existing approaches to minimize short channel effects. Still further embodiments of the present invention provide for the above mentioned solutions to be achieved with existing semiconductor processes and equipment without revamping well established tools and techniques.

The preferred embodiment of the present invention, lateral doped channel, is thus described. While the present invention has been described in particular embodiments, it should be appreciated that the present invention should not be construed as limited by such embodiments, but rather construed according to the below claims.

What is claimed is:

1. A method of manufacturing a lateral doped channel comprising:

implanting a first doping material substantially vertically into a first region adjacent to a gate structure and into a second region adjacent to said gate structure, wherein said first doping material is a P-type doping material;

constructing spacers adjacent to said gate structure; and implanting a second doping material substantially vertically into said first region adjacent to said gate structure and into said second region adjacent to said gate structure to form a source region and a drain region respectively, wherein said spacers substantially prevent implantation of said second doping material into regions substantially beneath said spacers, wherein said second doping material is an N-type doping material, and wherein said regions beneath said spacers maintain said first doping material as a dominant dopant, wherein said lateral doped channel is part of a memory semiconductor cell.

2. The method as described in claim 1 wherein said memory semiconductor cell is non-volatile.

3. The method as described in claim 2 wherein said memory semiconductor cell comprises a nitride layer as a storage element.

4. The method as described in claim 2 wherein said memory semiconductor cell comprises a floating gate as a storage element.

5. The method of manufacturing a lateral doped channel as described in claim 1 wherein said second doping material substantially dominates the charge carrier characteristics of a region implanted by said second doping material.

* * * * *